United States Patent [19]
Fraas et al.

[11] Patent Number: 5,248,346
[45] Date of Patent: Sep. 28, 1993

[54] PHOTOVOLTAIC CELL AND ARRAY WITH INHERENT BYPASS DIODE

[75] Inventors: Louis M. Fraas, Issaquah; James E. Avery, Fall City, both of Wash.

[73] Assignee: The Boeing Company, Seattle, Wash.

[21] Appl. No.: 840,509

[22] Filed: Feb. 24, 1992

Related U.S. Application Data

[60] Continuation-in-part of Ser. No. 717,635, Jun. 19, 1991, Pat. No. 5,123,968, and a continuation-in-part of Ser. No. 527,061, May 21, 1990, Pat. No. 5,096,505, Ser. No. 527,038, May 21, 1990, Pat. No. 5,118,361, and Ser. No. 755,316, Sep. 5, 1991, said Ser. No. 717,635, is a division of Ser. No. 523,710, May 14, 1990, Pat. No. 5,091,018, which is a continuation-in-part of Ser. No. 339,311, Apr. 17, 1989, abandoned.

[51] Int. Cl.$^5$ .................................... H01L 31/05
[52] U.S. Cl. .................................... 136/244; 136/249; 136/262; 136/293
[58] Field of Search ................ 136/244, 249 TJ, 261, 136/262, 264, 265, 293

[56] References Cited

U.S. PATENT DOCUMENTS

| | | | |
|---|---|---|---|
| 2,603,692 | 7/1952 | Scaff et al. | 357/9 |
| 3,264,707 | 8/1966 | Elie | 437/167 |
| 4,658,086 | 4/1987 | McLeod et al. | 136/249 |
| 4,746,371 | 5/1988 | McLeod et al. | 136/249 |
| 4,776,893 | 10/1988 | McLeod et al. | 136/249 |
| 4,818,357 | 4/1989 | Case et al. | 204/192.25 |

OTHER PUBLICATIONS

Fraas, et al., "High Efficiency GaAs/GaSb Tandem Solar Cells and Tandem Circuit Cards." Sandia Report 89-1543, Jul. 1989.
Avery, et al. "Tandem Concentrator Solar Cells With 30% (AMO) Power Conversion Efficiency."
Fraas, et al., "GaSb Booster Solar Cells for Over 30% Efficient Solar Cell Stacks," *Journal of Applied Physics*, 66(8); Oct. 15, 1989, pp. 3866-3870.
Fraas, eta l., "Tandem Solar Cells with 31% (AMO) and 37% (AMI 5.D) Energy Conversion Efficiencies." *IEEE Aerospace and Electronics Systems*, vol. 4, No. 11; Nov. 1989, pp. 3-9.
Fraas, et al., "High Efficiency GaAs/GaSb Tandem Solar Cells and Tandem Circuit Cards." *IEEE*, 1989; Document No. CH2781-3/89/0000-0815, pp. 815-820.
Sundaram, "GaAs Solar Cell Using an Alternative Arsenic Source." Material Research Society Symposium Proceedings, vol. 145, 1989, pp. 211-215.
Fraas, et al., "Vacuum Chemical Epitaxy: High Throughput GaAs Spitaxy Without Arsine." Interior Research Society Symposium Proceedings, vol. 145, 1989, pp. 253-258.
"Tertiary Butylarsine Grown GaAs Solar Cell." *Applied Physics Letters*, vol. 54, No. 7, Feb. 13, 1989, pp. 671-673.
Fraas, et al., "Over 35% Efficient GaAs/GaSb Tandem Solar Cells." *IEEE Transactions Electron Devices*, Feb. 1990.

*Primary Examiner*—Aaron Weisstuch
*Attorney, Agent, or Firm*—Christensen, O'Connor, Johnson & Kindness

[57] ABSTRACT

A photovoltaic cell (20) with a single pn-junction (46) is disclosed that is capable of functioning as both a current source and a bypass diode. The photovoltaic cell is made of material that has a low bandgap energy, 1.0 eV, or less. One version of the photovoltaic cell is formed of a GaSb wafer doped with Te to form an n-region (22); the Te concentration is between 3 and $15 \times 10^{17}$ atoms/cm$^3$. Multiple photovoltaic cells of this invention can be connected in series and placed in parallel across a like number of photovoltaic cells (76) that do not function as tunnel diodes in order to form a power-generating array (70). The photovoltaic cells are arranged in tandem pairs so that the photovoltaic cells (76), which are transparent to the light absorbed by the photovoltaic cells (20), overlie the photovoltaic cells (20). In the event one of the photovoltaic cell pairs (20, 76) is rendered inactive, current will flow through the inactive photovoltaic cell (20) to minimize the drop in output current from the array.

20 Claims, 4 Drawing Sheets

PHOTOVOLTAIC CELL AND ARRAY WITH INHERENT BYPASS DIODE

REFERENCE TO RELATED APPLICATIONS

This application is a continuation-in-part of U.S. patent application Ser. No. 07/717,635, filed Jun. 19, 1991, now U.S. Pat. No. 5,123,968, which is a divisional of U.S. patent application Ser. No. 07/523,710 filed May 14, 1990, now U.S. Pat. No. 5,091,018, which was a continuation-in-part of application Ser. No. 07/339,311, filed Apr. 17, 1989, now abandoned. This application is also a continuation-in-part of application Ser. No. 07/527,061, filed May 21, 1990, now U.S. patent No. 5,096,505, application Ser. No. 07/527,038 filed May 21, 1990, now U.S. Pat. No. 5,118,361, and application Ser. No. 07/755,316, filed Sep. 5, 1991. Each of these applications is incorporated herein by reference.

FIELD OF THE INVENTION

This application relates to photovoltaic cells and, more particularly, to a photovoltaic cell with an inherent bypass diode and to power supply assemblies that can be constructed with this photovoltaic cell.

BACKGROUND OF THE INVENTION

A photovoltaic cell is an electrical device formed of semiconducting material able to absorb radiant light energy and convert it directly into electrical energy. Some photovoltaic cells are employed as sensors in cameras and the like to obtain an electrical signal or measure of the ambient light. Other photovoltaic cells are used to generate electrical power. Photovoltaic cells are typically used to power electrical equipment for which it has otherwise proved difficult or inconvenient to provide a source of continual electrical energy.

An individual photovoltaic cell has a distinct spectrum of light to which it is responsive. The particular spectrum of light to which a photovoltaic cell is sensitive is primarily a function of the material forming the cell. Photovoltaic cells that are sensitive to light energy emitted by the sun are commonly referred to as solar cells. Individually, any given photovoltaic cell is capable of generating only a relatively small amount of power, for example, some solar cells generate power in the range of 0.5 to 3.0 watts. Consequently, for most power generation applications, multiple photovoltaic cells are connected together in series into a single unit, an array. When a photovoltaic cell array, such as a solar cell array, is placed outdoors, a shadow or obstruction can temporarily or permanently cover one or more of its photovoltaic cells so they are blocked from receiving light and are unable to generate power.

Electrically, a conventional photovoltaic cell may be considered equivalent to a current source in parallel with a diode that is forward biased relative to the current source. Problems arise in a series-connected photovoltaic cell array when an individual cell ceases to generate electricity because the diode characteristics of the inactive photovoltaic cell cause that cell to appear as a reverse-biased diode to the other cells. The inactive cell blocks current flow and a large voltage develops across the cell. Consequently, the inactive photovoltaic cell, instead of functioning as a current source, functions as a power sink that can consume most of the energy produced by the remaining active photovoltaic cells. The power output of the array falls dramatically. Moreover, the power consumed by the inactive photovoltaic cell is converted into heat, which damages the photovoltaic cells and/or the surrounding components to promote their failure. Also, exposure to large voltages for extended periods of time across an individual photovoltaic cell can cause the semiconducting material forming the cell to break down permanently, resulting in a cell failure.

To prevent these problems, arrays customarily include a forward-biased diode, i.e., a bypass diode, connected in parallel across sets of one or more of the cells that form the array. In the event a cell is rendered inactive, current will flow through the bypass diode eliminating the loss of power and the generation of heat.

While bypass diodes have proved a useful addition to photovoltaic cell arrays, they have their own disadvantages. Having to provide these diodes adds to the overall cost of any array. Furthermore, the addition of the diodes adds to both the weight and size of the cell array.

SUMMARY OF THE INVENTION

This invention relates to a photovoltaic cell that inherently includes a bypass diode and the power supply circuits that can be assembled with this cell.

The photovoltaic cell of this invention is constructed of semiconductor material that, in addition to developing an electrical potential when exposed to light, also functions as a back bypass "tunneling" diode when a reverse voltage is applied thereto. This effect occurs in photovoltaic cells made from semiconducting materials having relatively low bandgap energy levels, less than approximately 1.0 eV, particularly, germanium, indium gallium arsenide, and indium gallium arsenide phosphide. Gallium antimonide (GaSb), for example, has a bandgap energy of approximately 0.72 eV. A GaSb photovoltaic cell of this invention is fabricated by doping a basic GaSb wafer with high concentrations of tellurium to create an n-region. The surface of the wafer is selectively counterdoped with zinc to create a p-region in opposition to the underlying n-region. With a sufficiently heavy doping of tellurium, the cell will have inherent bypass diode protection for the array in which it is used.

When the photovoltaic cell of this invention is in series with other cells, or other current sources, its tunneling diode characteristics allow reverse current to flow therethrough with minimal resistance. In other words, an inactive photovoltaic cell of this invention appears more as a low-resistance resistor than as an open circuit to the other current-producing components with which it is connected. It consumes a negligible amount of power, does not heat up significantly, and does not break down permanently.

The photovoltaic cell of this invention is well suited for assembly in series with other photovoltaic cells to form a multicell array. Since the photovoltaic cell of this invention inherently functions as a bypass diode, there is no need to provide an additional diode to protect the array in the event the cell is rendered inactive. One particular power supply circuit for which the photovoltaic cell of this invention is especially well suited is the tandem-type solar cell array. In this type of array, solar cells of this invention are each mounted in tandem with other solar cells that may not have the characteristics of the cells of this invention. These second type of solar cells absorb light at a different wavelength from that absorbed by the cells of this invention; they are transparent to the light absorbed by the solar cells of this invention. In this arrangement, the solar cells of this invention are connected together in series and are connected in parallel across the other cells of the array. In the event any tandem pair of solar cells is rendered inactive, the solar cell of this invention will function as a bypass diode to allow current to flow. The array will still generate a significant amount of power. If the entire array is rendered inactive, the solar cells of this invention will collectively function as series-connected diodes. Thus, if the inactive array is connected in series with other arrays, the amount of power generated by the complete assembly will not be appreciably reduced.

DETAILED DESCRIPTION OF THE PREFERRED EMBODIMENT

Figure 1:
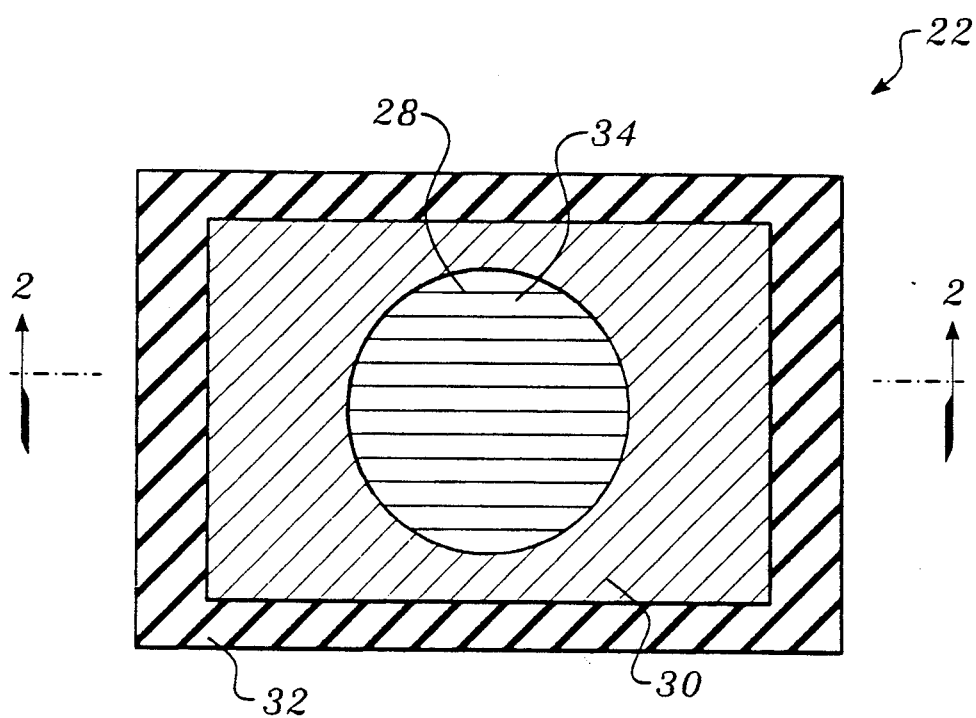
FIG. 1 is a plan view of a photovoltaic cell of this invention.
Figure 2:
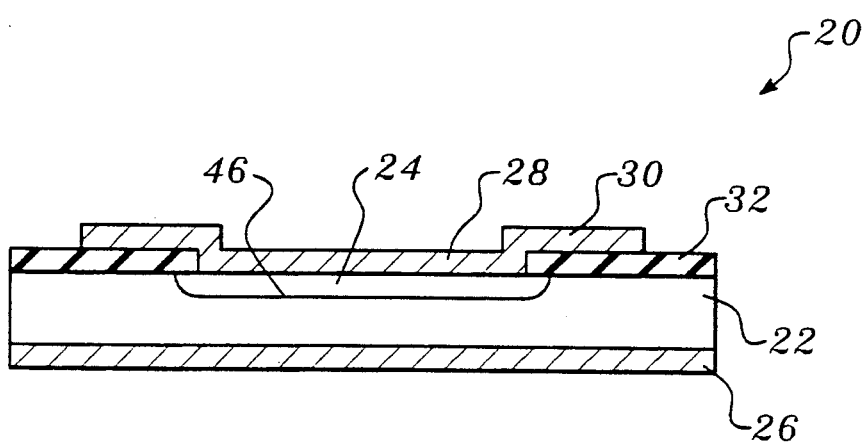
FIG. 2 is a sectional view of the photovoltaic cell of this invention taken generally along line 2—2 of FIG. 1.

FIGS. 1 and 2 illustrate a photovoltaic cell 20 of the present invention that inherently includes a bypass diode. Cell 20 is formed of gallium antimonide (GaSb) and includes both an electron-emitting n-region 22 and an electron-accepting p-region 24. The n-region 22 is the largest portion of the photovoltaic cell 20; the p-region 24 occupies only a relatively small circular space on the top portion of the n-region. As will be discussed, the n-region 22 is formed by doping the basic GaSb structure with tellurium (Te), and the p-region 24 is formed by counterdoping the tellurium-doped structure with zinc. A metalized base 26 bonded to the underside of the n-region 22 functions as the negative terminal for the photovoltaic cell 20. Relatively narrow grid lines 28 that extend across the p-region 24 provide a conductive path so that electrons can flow into the photovoltaic cell 24. The opposed ends of the grid lines 28 are attached to a wider bus conductor 30 located on the surface of the photovoltaic cell 20 that extends around the p-region 24 and that functions as the positive terminal. Bus conductor 30 is separated from the underlying n-region 22 by an insulating mask 32, such a silicon nitride. An antireflective coating 34 that serves to maximize the amount of light absorbed by the p-region 24 is located on top of the p-region. Antireflective coating 34 is disposed in the interstitial spaces between grid lines 28.

The process of fabricating the GaSb photovoltaic cell 20 of this invention is generally applicable to III-V diffused-junction photovoltaic cells and is described more completely in U.S. patent application Ser. No. 07/755,316. Initially, a single crystal wafer of GaSb is doped to form the n-region so that it has a room-temperature carrier concentration of approximately $5 \times 10^{17}$ atoms/cm$^3$. In the preferred embodiments of the invention, the GaSb wafer is doped with tellurium (Te). One range for doping the wafer with tellurium is such that there is a tellurium concentration of between 3 and $15 \times 10^{17}$ atoms/cm$^3$; a second range for doping the wafer is between 6 and $10 \times 10^{17}$ atoms/cm$^3$. After the wafer is doped to form the n-region, the insulation mask is formed by initially applying an insulating layer to the upper surface of the wafer. Silicon nitride functions well as the insulating layer because it is a good dielectric and can prevent oxidation of the underlying n-doped region of the solar cell, can withstand the subsequent thermal cycling of the cell that otherwise occurs during the later manufacturing steps, and serves as a barrier against unwanted zinc diffusion that occurs during the p-doping steps described below. The silicon nitride may be applied to the wafer to have a thickness of 0.1 micron.

The insulating layer is next treated to form an opening exposing a portion of the GaSb wafer by using standard photolithography techniques. Thus, a layer of photoresist may be deposited in a pattern on the insulating layer. Thereafter, the photoresist is developed to selectively remove the insulating layer to define both the insulation mask and the adjacent opening. In some preferred versions of the invention, the insulating layer is selectively removed so that the opening is circular and has a diameter between 4 and 9 millimeters. In more preferred versions of the invention, the material forming the insulating layer is removed to form an opening having a diameter between 5 and 6 millimeters. After the opening is formed, a p-type dopant, such as zinc, is diffused into the exposed surface of the GaSb wafer to serve as a conductivity-type modifier to form a first emitter region that is part of the p-region. In some preferred versions of the invention, zinc is diffused into the wafer to form a p-type emitter that has a surface area equal to that of the opening and a thickness of approximately 0.1 micron so that the zinc concentration in the first emitter region is between approximately $10^{20}$ and $10^{21}$ atoms/cm$^3$. The diffusion step may be accomplished by using a quasi-closed graphite box in a conventional manner. The box has a molten zinc-gallium source. The molten zinc source provides a source of p-type dopant atoms, which diffuse through the opening into the lattice of the n-doped wafer. The concentration versus depth into the wafer of the zinc dopant atoms is a function of time and temperature.

After the initial zinc diffusion step, a second zinc diffusion step is performed to increase the size of the p-region in the vicinity of where the grid lines will be disposed. This process starts with the application of a second silicon nitride layer to the surface of the wafer. The second silicon nitride layer, in addition to covering the initially applied insulation mask, also covers the opening defined by the perimeter of the insulation mask. After the second silicon nitride layer is applied, it is selectively developed to form openings above the first emitter region to define the spaces in which the grid lines are to be formed. The wafer is then subjected to a second diffusion process to introduce zinc dopant into the previously formed first emitter region in the vicinity of the openings. This diffusion causes the formation of a set of zinc-concentrated second emitter regions that extend downward from the lower portions of the first emitter region and are integral therewith. In some preferred versions of the invention, the second emitter regions have a profile of vertically oriented rectangles that have rounded corners and that are laterally centered around the openings with which they are associated. These second emitter regions are each approximately 1.0 micron thick. Collectively, the first emitter region and the second emitter regions form p-region 24 to define a single pn-junction 46 with n-region 22 (FIG. 2). As a consequence of the zinc diffusion processes, an unwanted zinc-diffused region forms on the backside of the wafer.

The backside or lower surface of the wafer is thereafter nonselectively etched to remove the unwanted zinc diffusion layer. The base contact 26 is then formed on the backside of the wafer. The base contact must have a low electrical resistance, be adhesive to the lower surface of the wafer, and meet the qualifications for use in space or terrestrial applications. The base contact is typically formed of two or more different layers of different metals and/or metal alloys. One base contact is, for example, formed of a gold-tin inner layer adjacent the n-region, an intermediate platinum layer, and an outer layer formed of gold that serves as a bonding area. The gold-tin alloy of the inner layer adheres well to the wafer. The pure gold of the outer layer forms a surface to which electrical conductors can easily be bonded. The platinum of the intermediate layer serves as a barrier that prevents the tin from diffusing into the outer layer. In another embodiment of the invention, base contact 26 is formed with an indium-tin oxide (ITO) layer adjacent the wafer and an outer layer formed of silver.

After formation of the base contact, grid lines 28 and the bus conductor 30 are formed. Initially, a thin layer of photoresist (not illustrated) is applied to the top of the wafer. The photoresist is then selectively developed to define openings that correspond to the pattern of the grid lines and the bus connector. In practice, the openings in the photoresist that define the grid lines are slightly wider than the underlying openings in the second silicon nitride layer. For example, openings in the second silicon nitride layer may be approximately 6.0 microns in width and the corresponding openings in the photoresist may be approximately 8.0 microns in width. A layer of metal forming the grid lines and the bus conductor 30 is then disposed over the top surface of the wafer. The remaining photoresist is then stripped from the surface of the wafer to form the grid lines 28 and bus conductor 30. In the preferred versions of the invention, the metal forming the grid lines 28 and bus conductor 30 comprises a layer of palladium under a layer of gold. At the completion of processing, the thickness of the grid lines 28 and the bus conductor may be approximately 2.0 microns.

The second silicon nitride layer of this photovoltaic cell serves three functions. The portion of this silicon nitride layer that overlies the insulation mask serves as part of the insulation mask. During the manufacture of the photovoltaic cell, the portion of the second silicon nitride layer that overlies the p-region serves as the diffusion mask to allow the selective formation of the second emitter regions. After manufacture of the photovoltaic cell, the portion of the second silicon nitride layer that overlies the p-region functions as the antireflective coating 34 (FIG. 1) to maximize the amount of light absorbed by the cell.

Since the openings in the photoresist through which the grid lines 28 were formed are wider than the underlying openings in the second silicon nitride layer, the grid lines are formed with rivet-like head sections that extend over the underlying second silicon nitride layer. This increases the mechanical bonding of the metal forming the grid lines to the surface of the photovoltaic cell.

Figure 3:
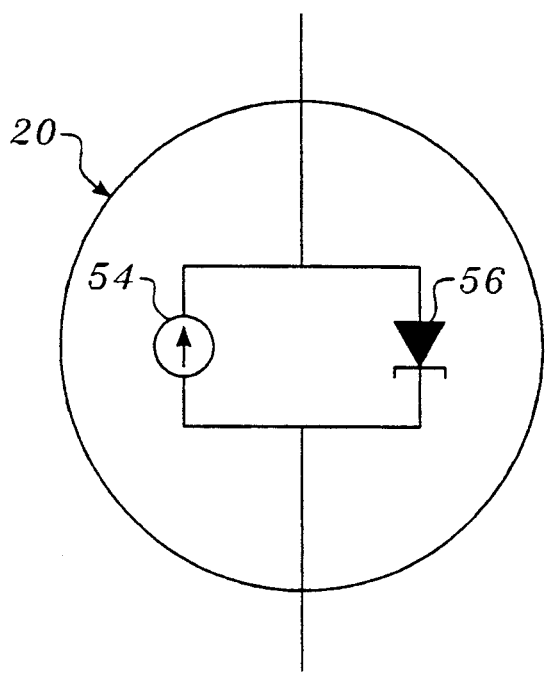
FIG. 3 is a schematic drawing illustrating how the photovoltaic cell of this invention can be electrically viewed.

Photovoltaic cell 20 of this invention, though having a single pn-junction 46, performs two functions, as depicted schematically by FIG. 3. When the cell 20 is active, photons of light energy strike the cell and excite electrons in valence orbits around the GaSb to enter higher, conduction band orbits. This forms holes in the lower energy valence band orbits. The electrons are free to move between conduction band orbits of the GaSb; the holes are able to move freely between the valence band orbits. This displacement of free charges causes a voltage difference between the n-region 22 and the p-region 24 wherein the p-region is electron poor or more positive. When a load is connected across the two regions, the current flows from the p-region 24, through the load, to the n-region 22 as represented by current source symbol 54.

When the photovoltaic cell 20 is not exposed to light energy, the electrons are not so excited and no such voltage difference develops. In this state, photovoltaic cell 20 is inactive. However, since the photovoltaic cell 20 of this invention has a relatively low bandgap energy, specifically a bandgap energy of 0.72 eV, when the cell is inactive, a relatively small current applied to the n-region 22 will excite the electrons to the point where they will move from valence band orbits to the higher conduction band orbits. Consequently, electrons are able to travel between the conduction band orbits of the GaSb so that the cell 20 functions as a low-resistance conductor. In other words, photovoltaic cell 20 functions as a tunneling diode 56, represented by the symbol for a backward diode, in that, once a particular back-bias voltage breakdown level is reached, it becomes conductive, allowing electron flow therethrough. It should be noted that this breakdown is nondestructive; it does not serve to permanently damage the semiconducting material forming the photovoltaic cell 20. Thus, the photovoltaic cell 20 of this invention, in addition to developing a potential when exposed to light, functions as its own bypass diode in the event it is rendered inactive and cannot emit a current. This eliminates the need to have either to connect a discrete bypass diode across the cell 20 or to fabricate a separate bypass diode on the semiconductor on which the cell is formed.

Mathematically, the tunneling current flow, J, across the pn-junction 46 can be expressed as:

$$J = A(N^{0.5}/V_g^{0.5})V(V_g - V)^{0.5} \exp\{-BV_g^{1.5}/[N^{0.5}(V_g - V)^{0.5}]\}$$

where A and B are constants, N is the n-dopant concentration, $V_g$ the bandgap energy level of the semiconducting material, and V the voltage across the junction. This formula is based upon the principle that the tunneling current across a pn-junction is a function of both the electric field across the junction and the bandgap energy level of the semiconducting material forming the junction. The electric field across the junction is a function of the difference between the built-in potential of the semiconducting material and the voltage across the semiconducting material and is further inversely proportional to the width of the depletion layer. For the semiconducting material forming a photovoltaic cell, the width of the depletion layer is generally inversely proportional to the concentration of n-dopants or p- dopants, whichever is lower, in the semiconducting material.

For example, depending on the n-dopant concentration, an indium gallium arsenide (InGaAs) photovoltaic cell can be fabricated to either include or not include an inherent bypass diode. When an InGaAs wafer is first fabricated, it has an inherent p-dopant concentration of approximately $10^{15}$ carriers/cm$^3$. The wafer is then subjected to a first doping to form the n-region. If the final photovoltaic cell is not intended to function as its own bypass diode, the wafer will be doped with only a relatively small amount of n-dopant, for example, approximately $5 \times 10^{16}$ atom/cm$^3$ Te. If the photovoltaic cell is intended to function as its own bypass diode, the wafer will instead be doped with a relatively high amount of n-dopant, for example, approximately, $5 \times 10^{17}$ atoms/cm$^3$. After the wafer is n-doped, it is subjected to a counterdoping to form a p-region so that the wafer will serve as a photovoltaic cell. Zinc, or other p-dopant, is introduced into the wafer to form a p-region. The concentration of p-dopant is typically in the range of $10^{19}$ to $10^{20}$ atoms/cm$^3$.

The extra n-dopant added to the InGaAs wafer to form the bypass diode reduces the width of the depletion layer, the region in which the charge-carrier density is insufficient to neutralize the fixed density of donors and acceptors. The minimization of the depletion zone serves to increase the strength of the electric field that forms at the pn-junction. The increase in field strength, in combination with the relatively low bandgap energy of the semiconducting material, minimizes the reverse-biased potential that needs to be applied to the photovoltaic cell in order to cause substantive current flow. In other words, since the pn-junction of the photovoltaic cell has a relatively small depletion zone, and requires the application of a relative small amount of energy to excite the electrons into conduction band orbits, the cell has a relatively low reverse-bias breakdown voltage.

Figures 4A, 4B:
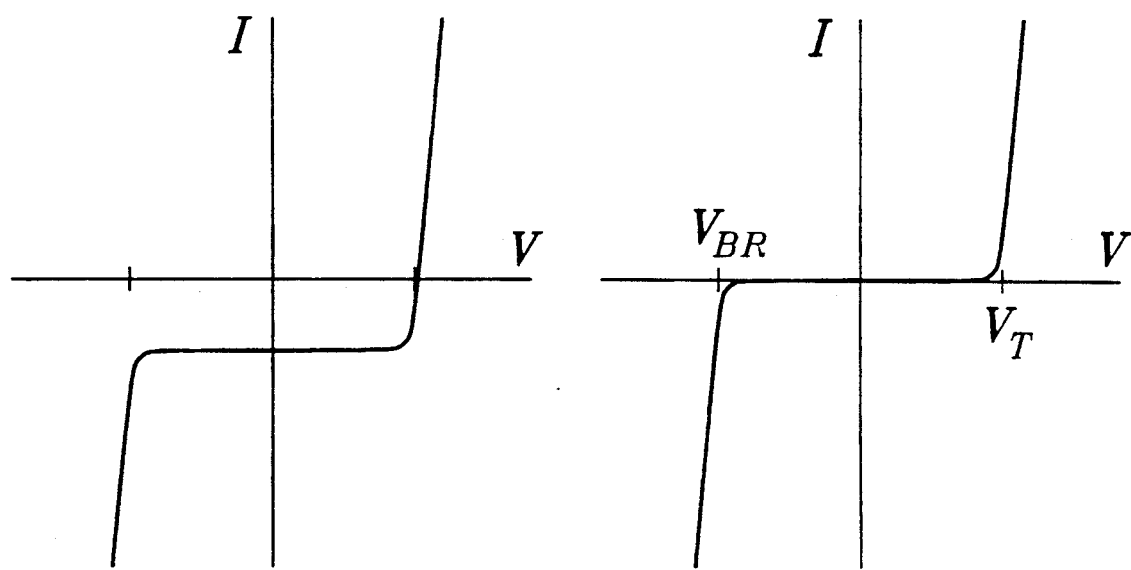
FIGS. 4A and 4B are current-voltage profiles for the photovoltaic cell of this invention for when the cell is both in the illuminated, active, state and in the shaded, inactive, state.

FIGS. 4A and 4B graphically depict the current-voltage profile for photovoltaic cell 20 for illuminated and nonilluminated, or shaded, states, respectively. As depicted by FIG. 4A, when photovoltaic cell 20 is illuminated, and active, it has a forward voltage. The p-region 24, the anode of the cell, has a greater potential than n-region 22, the cathode of the cell. At the same time, the photovoltaic cell 20 initially has a reverse, or negative, current in that current flow out of the cell through a load connected across the cell is from the p-region 24 through the load and back to the n-region 22. In other words, in comparison to passive electrical components, photovoltaic cell 20, when illuminated, instead of consuming power, functions as a power generator. At relatively low forward voltages, photovoltaic cell 20 emits a generally constant current. As the forward voltage across photovoltaic cell 20 increases, the reverse current starts to fall. Once a forward breakdown voltage is reached, current flow through photovoltaic cell 20 changes direction and becomes a forward current, from the n-region 22, through the load and to the p-region 24. The photovoltaic cell 20 thus ceases to be a current source and starts to function as a current sink.

When photovoltaic cell 20 is shaded and is rendered inactive, it functions as a tunneling diode, illustrated by FIG. 4B. At forward and reverse voltages near zero, there is nominal current flow into the cell. Once voltages greater than the forward-bias or reverse-bias breakdown voltages are exceeded, there is significant current flow through the photovoltaic cell 20. When a forward threshold voltage, $V_T$, is reached, forward current flow starts through the photovoltaic cell 20. When the reverse voltage exceeds a breakdown level, $V_{BR}$, the electrons are able to tunnel through the pn-junction 46; a reverse current flows through the cell. Since the reverse voltage across photovoltaic cell 20 and reverse current flowing through the cell are occurring simultaneously, the cell in this state is functioning as a power consumer. However, since there is only a small reverse voltage across photovoltaic cell 20, the actual amount of power consumed by the cell is relatively nominal. Depending on the Te concentration of the n-region 22, a GaSb photovoltaic cell 20 of this invention has been found to have a reverse breakdown voltage of between 0.4 and 1.2 volts. In general, an increase in Te concentration causes a decrease in the reverse breakdown voltage. The paper "Fundamental Characterization Studies of GaSb Solar Cells," by L. Fraas et al., presented at the Institute of Electrical and Electronic Engineers Twenty Second Conference on Photovoltaic Solar Cells in Las Vegas, Nev. in October 1991, and incorporated by reference, discloses the current-voltage characteristics for GaSb photovoltaic-cells doped with various concentrations of tellurium.

Figure 5:
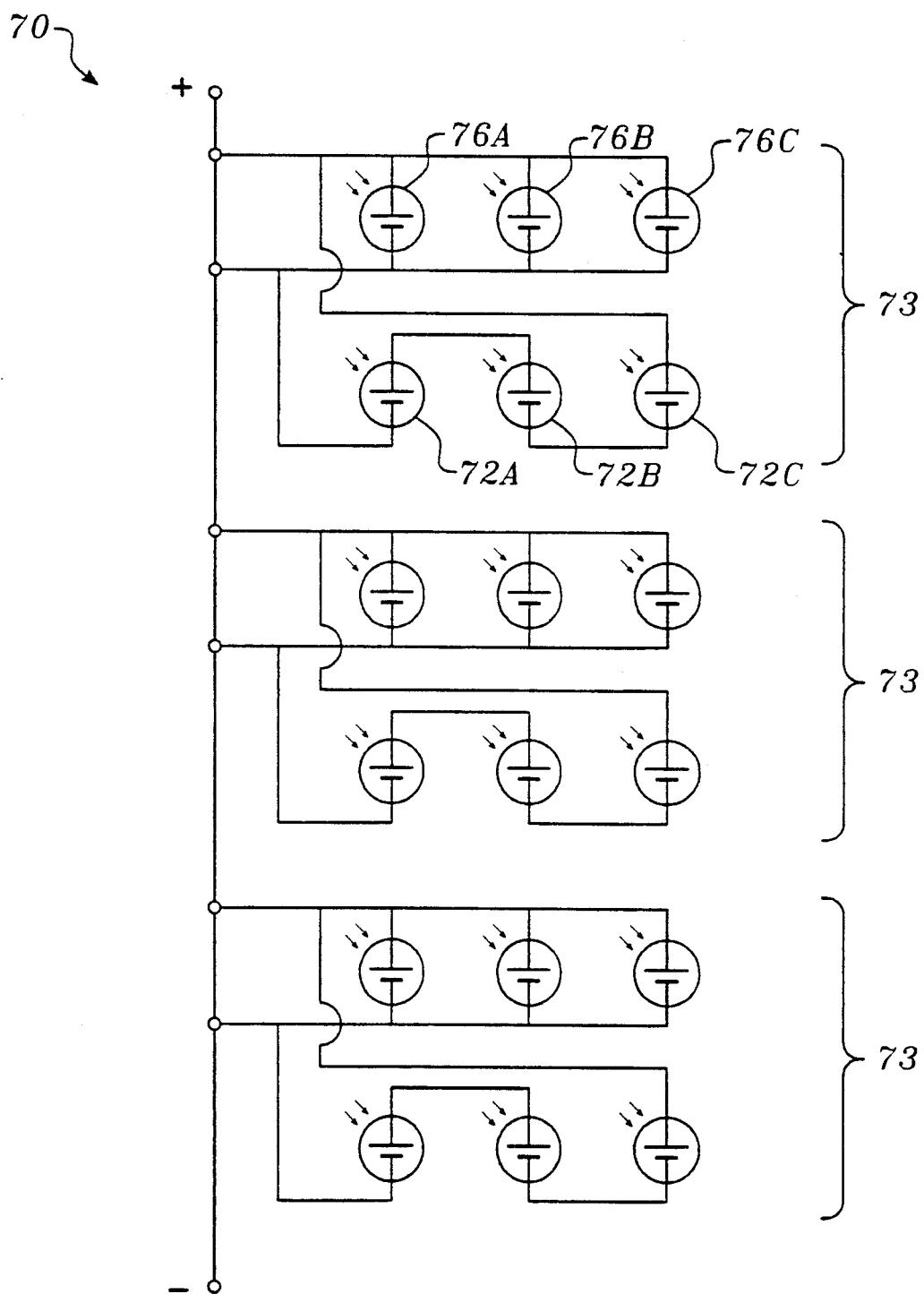
FIG. 5 is a schematic representation of a multicell power array in which the photovoltaic cell of this invention is incorporated.

FIG. 5 is a schematic diagram of a photovoltaic cell array 70 in which GaSb solar cells 72a, 72b, and 72c of this invention are employed. The array 70 consists of a number of series-connected subarrays 73, three subarrays shown. Array 70 is typically provided with a sufficient number of subarrays 73 so that for the application for which it is designed it can be approximately considered a constant current source. Each subarray 73 consists of three solar cells 72a, 72b, and 72c formed of GaSb. Each subarray 73 further includes three gallium arsenide (GaAs) photovoltaic cells, 76a, 76b, and 76c, respectively, each of which is paired with a separate one of the GaSb cells. Each GaAs/GaSb cell pair is arranged in a tandem configuration such that the GaAs cell 76 is located on top of the associated GaSb cell 72a, 72b, or 72c. The GaAs cells 76 have a relatively high bandgap energy and as such do not function as tunneling diodes. The GaAs cells 76 are transparent to the light that is absorbed and converted into energy by the underlying GaSb cells 20. Specifically, the GaSb cells 20 are sensitive to photons having infrared wavelengths (wavelengths between 900 and 1800 nm); the GaAs cells 76 are transparent to light at these wavelengths. In each subarray 73, the GaSb cells 72 collectively serve as booster cells to increase the power generated by the GaAs cells 76. The applications incorporated by reference disclose physical structures for tandem mounting the GaAs cells 76 and the GaSb cells 72. As discussed in those disclosures, each tandem pair of cells may be disposed on a flexible carrier formed of a polyimide tape. Conductors that connect the individual solar cells 72 and 76 together are disposed on the tape.

Under illumination, each GaAs photovoltaic cell 76 of each subarray 72 produces a 0.35-amp current at a 1.14-volt potential. Since the GaAs cells 76 are connected in parallel, collectively, the cells produce a combined current of 1.05 amps at 1.14 volts. The GaSb cells 72 each produce current of 0.25 amp at a 0.45-volt potential. Collectively, the series-connected GaSb cells 72 produce a current of 0.25 amps at 1.35 volts. Since the GaSb cells 72 produce the larger voltage, the output voltage of the subarray 73 is limited by the GaAs cells 76 to 1.14 volts. The current of the subarray 72 when illuminated is 1.3 amps, the sum of the current produced by the parallel-connected GaAs cells 76 and the series-connected GaSb cells 20.

Figure 6:
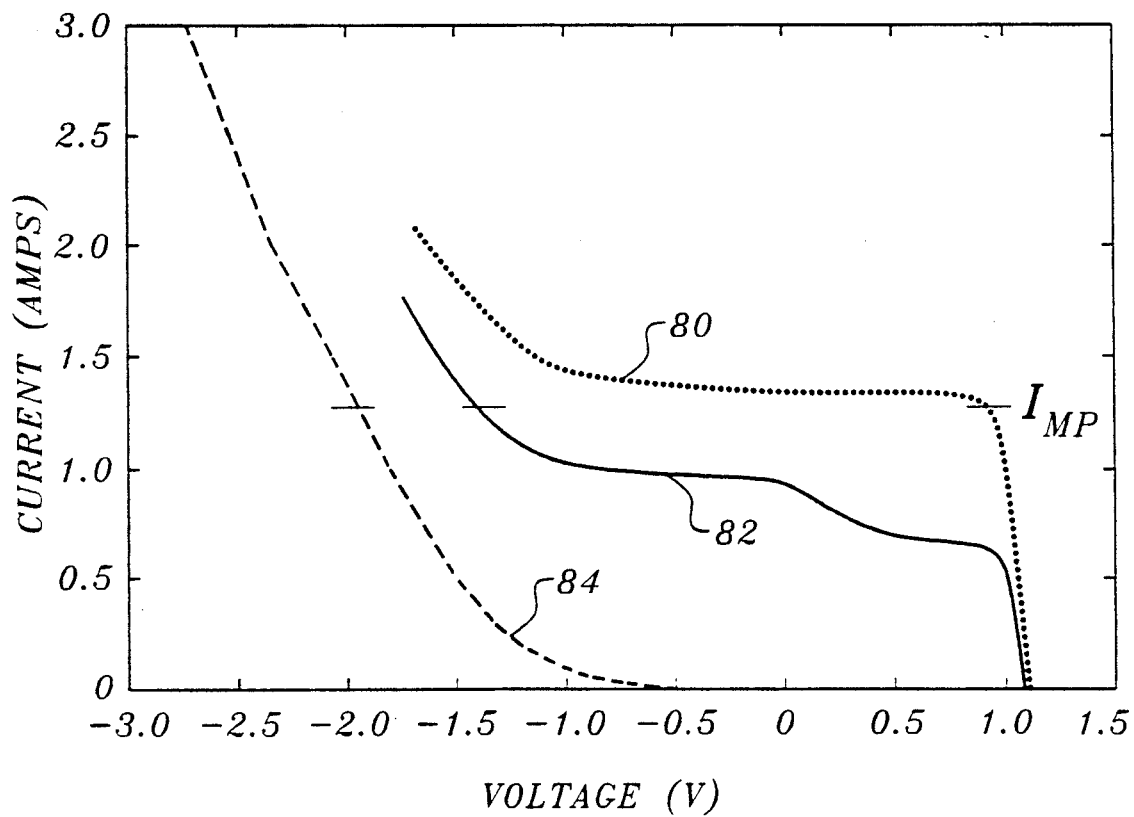
FIG. 6 is a graph of measured I-V characteristics of one subarray of the multicell power array of FIG. 5.

FIG. 6 depicts the current-voltage (I-V) characteristics for various active/inactive states of an individual subarray 73 when constant voltages are applied across the subarray. Dotted curve 80 represents the I-V characteristics of the subarraY 73 when each of the GaAs/-GaSb cell pairs is fully illuminated. In this situation, when nominal voltages are applied across the subarray, the current flow is relatively constant, approximately 1.3 amps. The application of positive voltages greater than approximately 1.0 volt results in a decay of the negative terminal-to-positive terminal current flow through the subarray. The application of voltages greater than approximately 1.14 volts, the output potential of the active GaAs cells 76, across the subarray 73 causes current flow to drop to zero. The application of larger voltages across the subarray 73 causes the current to flow therethrough from the positive terminal, through the solar cells to the negative terminal, curve not shown. In other words, once a voltage greater than 1.14 volts is applied across the subarray 73 it becomes a power sink. The subarray 73 similarly functions as a power sink whenever a negative voltage is applied thereacross.

When one of the tandem GaAs/GaSb cell pairs is shaded, the individual cells, for example, solar cells 72c and 76c, those cells cease generating a current. The I-V characteristics of the subarray 73 in this state are represented by solid line 82. The shaded GaAs cell 76c is effectively disconnected from the circuit, since it is parallel connected to the associated GaAs cells 76a and 76b so that the current continues to flow through those, still active, cells. Upon deactivation, the shaded GaSb cell 72c acts as a reverse-biased diode with respect to the other components forming the subarray 73. When voltages greater than 0.5 volt are applied across the subarray, it loses the current from the remaining active GaSb cells 72a and 72b. For example, when 0.7 volt is applied across the subarray 73, the remaining active GaSb cells 72a and 72b continue to generate a combined voltage of 0.9 volt. Consequently, in this situation, to maintain an equalization with the 0.7 volt applied across the GaSb cell string, a −0.2 volt, or reverse-bias voltage develops across the inactive cell 72c. In this instance there is only nominal current flow through the GaSb cell string as represented by the relatively large current difference between the array fully illuminated and one-cell-shaded states. However, once a voltage of less the 0.5 volt is applied across the subarray 73, the inactive GaSb cell 72c begins to break down to allow substantial current flow therethrough. For example, when a voltage of 0.1 volt is applied across the partially shaded subarray, the still active GaSb cells will continue to produce a 0.9-volt potential. To maintain equalization with the voltage across the subarray 73, a −0.8-volt back-bias voltage develops across the inactive GaSb cell 72c. At this voltage level, the semiconducting material forming the cell has undergone a nondestructive breakdown to allow current flow therethrough. The current produced by the other, still active, GaSb cells 72a and 72b flows through the inactive cell 72c to cause a rise in the current out of the cell. This is represented by the smaller current difference between the array fully illuminated and one-cell-shaded states at the 0.1-volt level as opposed to that at the 0.7-volt level.

Only a relatively small voltage drop occurs across the inactive GaSb cell 72c. In other words, the inherent bypass diode of the GaSb cell 72 of this invention prevents large, potentially destructive, voltages from developing across the GaAs cells with which it is associated. It should be understood that the GaSb cell of this invention functions as a bypass diode to allow current flow therethrough even if just one of the solar cells 72c or 74b forming the tandem pair is rendered inactive.

Dashed line 84 of FIG. 6 represents the I-V characteristics of the subarray 73 when all the cells are shaded. When forward-biased voltages are applied to the cell there is no current flow through the subarray 73. When back-bias voltages less than −0.5 volt are applied to the subarray 73, the GaSb cells start to nondestructively break down to start to allow current flow therethrough. At back-bias voltages near −1.5 volts, substantive current starts to flow through the inactive GaSb cells 72. At back-bias voltages less than −2.2 volts the GaSb cells 72 have essentially gone through a complete nondestructive breakdown and the current flow through the subarray 73 approaches the current flow that occurs when it is in the fully active state. Consequently, if an entire subarray 73 is rendered inactive, it does not appreciably consume a large portion of the power developed by the remaining, active components of the array 70. This invention eliminates the need to provide a bypass diode across the individual subarrays in order to minimize the power loss of the array 70 when one of the subarrays is rendered inactive.

A photovoltaic cell of this invention can be connected in series with a constant current source capable of generating significant potential. When photovoltaic cell 20 is active, it will develop a voltage that can be used to produce a current through the associated load. When the photovoltaic cell is inactive, it will function as a tunneling diode so that the voltage developed by the current source can be placed across the load to develop a current flow therethrough.

The foregoing description has been limited to a specific photovoltaic cell and a specific photovoltaic cell power array. It will be apparent, however, that variations and modifications can be made to the invention with the attainment of some or all of the advantages thereof. For example, while the described photovoltaic cell 20 is formed of a GaSb substrate, the invention includes photovoltaic cells formed from material having a bandgap voltage of less than approximately 1.0 eV and, preferably, less than 0.8 eV. Semiconducting material that falls in this range includes germanium (Ge), indium gallium arsenide ($In_xGa_{(1-x)}As$), and indium gallium arsenide phosphide ($In_xGa_{(1-x)}As_yP_{(1-y)}$). It may also be possible to fabricate the photovoltaic cell 20 of this invention out of copper indium diselenide ($CuInSe_2$), which has a bandgap energy level of approximately 1.0 eV. In some of these photovoltaic cells, the reverse breakdown voltage may approach 3.0 volts or more. Ideally though, the breakdown voltage should be less than 2.0 volts and more ideally less than 1.0 volt. In some situations it may be desirable to fabricate the photovoltaic cell so that it will breakdown with the application of a breakdown voltage as little as 0.3 volts. Also, with regard to the dopant concentrations discussed it should also be understood that they are similarly illustrative and not to be considered limiting. For example, with regard to the different n-dopant concentrations used to fabricate an InGaAs photovoltaic cell so that it can be made either with or without an inherent bypass diode, it should be understood that in some versions of the invention n-dopant concentrations of two, three, four or more orders of magnitude may be required to fabricate a cell with an inherent bypass diode in comparison to the concentrations needed to fabricate a fully functioning photovoltaic cell without an inherent bypass diode. Moreover, while the array 70 incorporates not only the photovoltaic cells 20 of this invention but other photovoltaic cells 76, other arrays in which the photovoltaic cells are employed need not include conventional photovoltaic cells. In other versions of the invention, the photovoltaic cells 20 of this invention may simply be strung together in series, without any other type of photovoltaic cells, to generate an output having selected voltage and amperage characteristics. In still other versions of this invention, it may be desirable to connect the photovoltaic cells of this invention to other power sources, such as batteries, to be able to take advantage of their characteristics of being able to both generate power and to serve as their own bypass diodes.

While the disclosed GaSb photovoltaic solar cell 20 is sensitive to one specific spectrum of light energy emitted by sun, the invention is not similarly limited. Other photovoltaic cells of this invention can be constructed that are sensitive to other wavelengths of light emitted by the sun. Moreover, still other versions of the invention can be constructed that are sensitive to light waves emitted by other light-generating sources. For example, some versions of the invention may be constructed to be sensitive to the light emitted by coherent light sources, such as lasers, while still other versions may be sensitive to the light emitted by glowing thermal sources, such as superheated tungsten rods.

Furthermore, it should similarly be understood that the disclosed method of manufacturing the photovoltaic cell 20 is illustrative and not limiting. In some methods of manufacture it may be desirable, for example, to initially fabricate the cells so that the p-region 24 is initially relatively thick and then to etch it back to reduce its overall size. It may also be desirable to provide a conductive grid-radically different from that which is shown. Therefore, it is an object of the appended claims to cover all such modifications and variations as come within the true spirit and scope of the invention.

While the preferred embodiment of the invention has been illustrated and described, it will be appreciated that various changes can be made therein without departing from the spirit and scope of the invention.

We claim:

1. A photovoltaic cell array comprising:
   a plurality of current-producing subarrays wherein said subarrays are connected in series and each said subarray includes:
   a first set of photovoltaic cells including at least one first type of photovoltaic cell having a first bandgap energy, said first type of photovoltaic cell capable of producing a current; and
   a second set of photovoltaic cells connected in parallel across said first set of photovoltaic cells including at least two photovoltaic cells of a second type connected in series, each said second type of photovoltaic cell formed of semiconducting material having a bandgap energy level, said semiconducting material having an n-region formed with an n-type dopant and a p-region formed with a p-type dopant adjacent said n-region to form a single pn-junction wherein said semiconducting material bandgap energy level and said n-dopant concentration are selected such that if one of said first or second types of photovoltaic cells of said subarray is rendered inactive, current produced by said array will flow through said subarray.

2. The photovoltaic cell array of claim 1, wherein said first and second types of photovoltaic cells are in pairs so that for every first type of photovoltaic cell there is a corresponding second type of photovoltaic cell and for every second type of photovoltaic cell there is a corresponding first type of photovoltaic cell.

3. The photovoltaic cell array of claim 2, wherein said first type of photovoltaic cells are transparent to wavelengths of light absorbed by said second type of photovoltaic cell and said pairs of first and second types of photovoltaic cells are arranged in tandem so that said first type of photovoltaic cells are disposed over said paired second type of photovoltaic cells.

4. The photovoltaic cell array of claim 2, wherein said first type of photovoltaic cells are connected in parallel groups.

5. The photovoltaic cell array of claim 2, wherein said second type of photovoltaic cells has a bandgap energy less than 1.0 eV.

6. The photovoltaic cell array of claim 2, wherein said second type of photovoltaic cells produces current in response to exposure to light having a wavelength of light emitted by the sun.

7. The photovoltaic cell array of claim 2, wherein said second type of photovoltaic cells produces current in response to exposure to light in the infrared wavelengths.

8. The photovoltaic cell array of claim 1, wherein said second type of photovoltaic cells are formed from GaSb, Ge, $In_xGa_{(1-x)}As$, $In_xGa_{(1-x)}As_yP_{(1-y)}$, or $CuInSe_2$.

9. The photovoltaic cell array of claim 1, wherein said second type of photovoltaic cells is formed from GaSb and has an n-region doped with Te to have a concentration between 3 and $15 \times 10^{17}$ atom/cm$^3$ Te.

10. The photovoltaic cell array of claim 9, wherein said first type of photovoltaic cells comprises GaAs.

11. The photovoltaic cell array of claim 9, wherein said subarray has a reverse breakdown voltage between about $-3.0$ to $-0.5$ volts.

12. A current-producing photovoltaic cell array for connection to a current source, said array comprising:
    a first set of photovoltaic cells including at least one first type of photovoltaic cell having a first bandgap energy, said first type of photovoltaic cell capable of producing a current; and
    a second set of photovoltaic cells connected in parallel across said first set of photovoltaic cells including at least two photovoltaic cells of a second type connected in series, each said second type of photovoltaic cell formed of semiconducting material having a bandgap energy level; said semiconducting material having an n-region formed with an n-type dopant and a p-region formed with p-type dopant adjacent said n-region to form a single pn-junction wherein said semiconducting material bandgap energy and said n-dopant concentration are selected such that if one of said first or second types of photovoltaic cells of said array is rendered inactive, current will flow through said array.

13. The photovoltaic cell array of claim 12, wherein said first and second types of photovoltaic cells are in pairs so that for every first type of photovoltaic cell there is a corresponding second type of photovoltaic cell and for every second type of photovoltaic cell there is a corresponding first type of photovoltaic cell.

14. The photovoltaic cell array of claim 13, wherein said first type of photovoltaic cells are transparent to wavelengths of light absorbed by said second type of photovoltaic cell and said pairs of first and second types of photovoltaic cells are arranged in tandem so that said first type of photovoltaic cells are disposed over said paired second type of photovoltaic cells.

15. The photovoltaic cell array of claim 13, wherein said first type of photovoltaic cells are connected in parallel groups.

16. The photovoltaic cell array of claim 13, wherein said second type of photovoltaic cells has a bandgap energy less than 1.0 eV.

17. The photovoltaic cell array of claim 12, wherein said second type of photovoltaic cells are formed from GaSb, Ge, $In_xGa_{(1-x)}As$, $In_xGa_{(1-x)}As_yP_{(1-y)}$, or $CuInSe_2$.

18. The photovoltaic cell array of claim 12, wherein said second type of photovoltaic cells has a bandgap energy less than 1.0 eV.

19. The photovoltaic cell array of claim 12, wherein said second type of photovoltaic cells produces current in response to exposure to light having a wavelength of light emitted by the sun.

20. The photovoltaic cell array of claim 12, wherein said second type of photovoltaic cells produces current in response to exposure to light in the infrared wavelengths.

* * * * *

UNITED STATES PATENT AND TRADEMARK OFFICE
CERTIFICATE OF CORRECTION

PATENT NO. : 5,248,346
DATED : September 28, 1993
INVENTOR(S) : L. M. Fraas et al.

It is certified that error appears in the above-indentified patent and that said Letters Patent is hereby corrected as shown below:

Title page, item [75], "Louis M. Fraas" should read --Lewis M. Fraas--

Signed and Sealed this

Tenth Day of May, 1994

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO. : 5,248,346  
DATED : September 28, 1993  
INVENTOR(S) : Fraas, et al Page 1 of 4

It is certified that error appears in the above-indentified patent and that said Letters Patent is hereby corrected as shown below:

The title page should be deleted to appear as per the attached title page.

Signed and Sealed this

Thirteenth Day of December, 1994

Attest:

BRUCE LEHMAN

*Attesting Officer*     *Commissioner of Patents and Trademarks*

United States Patent [19]

Fraas et al.

[11] Patent Number: 5,248,346
[45] Date of Patent: Sep. 28, 1993

[54] PHOTOVOLTAIC CELL AND ARRAY WITH INHERENT BYPASS DIODE

[75] Inventors: Louis M. Fraas, Issaquah; James E. Avery, Fall City, both of Wash.

[73] Assignee: The Boeing Company, Seattle, Wash.

[21] Appl. No.: 840,509

[22] Filed: Feb. 24, 1992

Related U.S. Application Data

[60] Continuation-in-part of Ser. No. 717,635, Jun. 19, 1991, Pat. No. 5,123,968, and a continuation-in-part of Ser. No. 527,061, May 21, 1990, Pat. No. 5,096,505, Ser. No. 527,038, May 21, 1990, Pat. No. 5,118,361, and Ser. No. 755,316, Sep. 5, 1991, said Ser. No. 717,635, is a division of Ser. No. 523,710, May 14, 1990, Pat. No. 5,091,018, which is a continuation-in-part of Ser. No. 339,311, Apr. 17, 1989, abandoned.

[51] Int. Cl.⁵ .............................................. H01L 31/05
[52] U.S. Cl. .................................... 136/244; 136/249; 136/262; 136/293
[58] Field of Search .................. 136/244, 249 TJ, 261, 136/262, 264, 265, 293

[56] References Cited

U.S. PATENT DOCUMENTS

| | | | |
|---|---|---|---|
| 2,603,692 | 7/1952 | Scaff et al. | 357/9 |
| 3,264,707 | 8/1966 | Elie | 437/167 |
| 4,658,086 | 4/1987 | McLeod et al. | 136/249 |
| 4,746,371 | 5/1988 | McLeod et al. | 136/249 |
| 4,776,893 | 10/1988 | McLeod et al. | 136/249 |
| 4,818,357 | 4/1989 | Case et al. | 204/192.25 |

OTHER PUBLICATIONS

Fraas, et al., "High Efficiency GaAs/GaSb Tandem Solar Cells and Tandem Circuit Cards." Sandia Report 89-1543, Jul. 1989.
Avery, et al. "Tandem Concentrator Solar Cells With 30% (AMO) Power Conversion Efficiency."
Fraas, et al., "GaSb Booster Solar Cells for Over 30% Efficient Solar Cell Stacks," *Journal of Applied Physics*, 66(8); Oct. 15, 1989, pp. 3866-3870.
Fraas, eta l., "Tandem Solar Cells with 31% (AMO) and 37% (AMI 5.D) Energy Conversion Efficiencies." *IEEE Aerospace and Electronics Systems*, vol. 4, No. 11; Nov. 1989, pp. 3-9.
Fraas, et al., "High Efficiency GaAs/GaSb Tandem Solar Cells and Tandem Circuit Cards." *IEEE*, 1989; Document No. CH2781-3/89/0000-0815, pp. 815-820.
Sundaram, "GaAs Solar Cell Using an Alternative Arsenic Source." Material Research Society Symposium Proceedings, vol. 145, 1989, pp. 211-215.
Fraas, et al., "Vacuum Chemical Epitaxy: High Throughout GaAs Spitaxy Without Arsine." Interior Research Society Symposium Proceedings, vol. 145, 1989, pp. 253-258.
"Tertiary Butylarsine Grown GaAs Solar Cell." *Applied Physics Letters*, vol. 54, No. 7, Feb. 13, 1989, pp. 671-673.
Fraas, et al., "Over 35% Efficient GaAs/GaSb Tandem Solar Cells." *IEEE Transactions Electron Devices*, Feb. 1990.

*Primary Examiner*—Aaron Weisstuch
*Attorney, Agent, or Firm*—Christensen, O'Connor, Johnson & Kindness

[57] ABSTRACT

A photovoltaic cell (20) with a single pn-junction (46) is disclosed that is capable of functioning as both a current source and a bypass diode. The photovoltaic cell is made of material that has a low bandgap energy, 1.0 eV, or less. One version of the photovoltaic cell is formed of a GaSb wafer doped with Te to form an n-region (22); the Te concentration is between 3 and $15 \times 10^{17}$ atoms/cm³. Multiple photovoltaic cells of this invention can be connected in series and placed in parallel across a like number of photovoltaic cells (76) that do not function as tunnel diodes in order to form a power-generating array (70). The photovoltaic cells are arranged in tandem pairs so that the photovoltaic cells (76), which are transparent to the light absorbed by the photovoltaic cells (20), overlie the photovoltaic cells (20). In the event one of the photovoltaic cell pairs (20, 76) is rendered inactive, current will flow through the inactive photovoltaic cell (20) to minimize the drop in output current from the array.

20 Claims, 4 Drawing Sheets

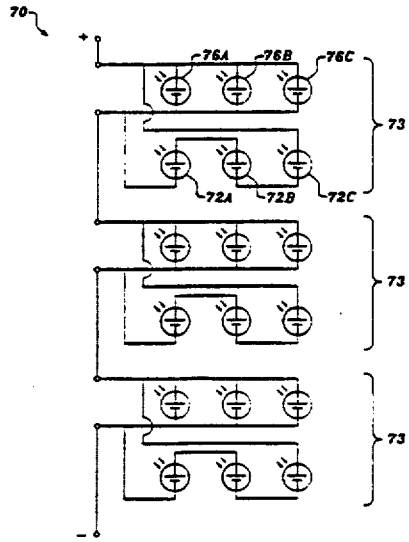

UNITED STATES PATENT AND TRADEMARK OFFICE
CERTIFICATE OF CORRECTION

PATENT NO.   : 5,248,346
DATED        : September 28, 1993
INVENTOR(S)  : Fraas, et al It is certified that error appears in the above-indentified patent and that said Letters Patent is hereby corrected as shown below:

Figure 5, should be deleted to appear as per attached page.

UNITED STATES PATENT AND TRADEMARK OFFICE
CERTIFICATE OF CORRECTION

PATENT NO. : 5,248,346

DATED : September 28, 1993

INVENTOR(S) : Fraas, et al

It is certified that error appears in the above-identified patent and that said Letters Patent is hereby corrected as shown below:

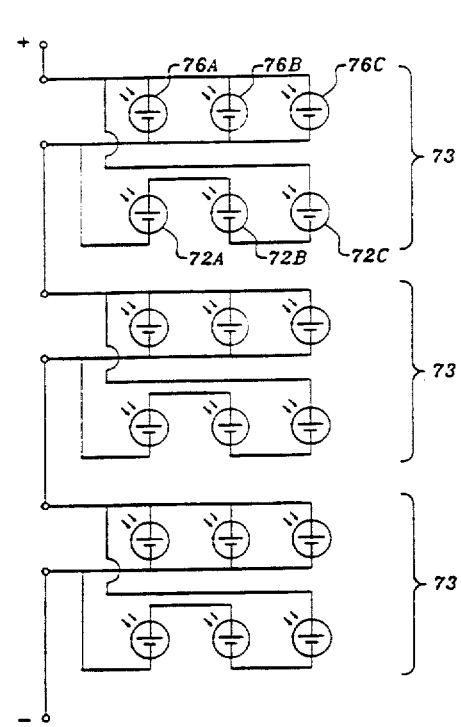

FIG. 5.